(12) United States Patent
Yamane

(10) Patent No.: US 8,963,403 B2
(45) Date of Patent: Feb. 24, 2015

(54) PIEZOELECTRIC DEVICE AND METHOD FOR MANUFACTURING THEREOF

(75) Inventor: Takashi Yamane, Nagaokakyo (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 274 days.

(21) Appl. No.: 13/310,109

(22) Filed: Dec. 2, 2011

(65) Prior Publication Data

US 2012/0139392 A1 Jun. 7, 2012

(30) Foreign Application Priority Data

Dec. 7, 2010 (JP) ................................. 2010-272460

(51) Int. Cl.
*H03H 9/13* (2006.01)
*H03H 3/04* (2006.01)
*H03H 9/56* (2006.01)

(52) U.S. Cl.
CPC ................. *H03H 3/04* (2013.01); *H03H 9/132* (2013.01); *H03H 9/564* (2013.01); *H03H 9/568* (2013.01); *H03H 2003/0471* (2013.01)
USPC ............................ 310/365; 310/312; 310/320

(58) Field of Classification Search
CPC ......... H03H 3/04; H03H 9/132; H03H 9/131; H03H 9/568; H03H 9/564
USPC ........................... 310/312, 320, 321, 365, 366
See application file for complete search history.

(56) References Cited

U.S. PATENT DOCUMENTS

| | | | | |
|---|---|---|---|---|
| 7,675,389 B2* | 3/2010 | Yamakawa et al. | ............ | 333/133 |
| 2002/0121840 A1* | 9/2002 | Larson et al. | ................. | 310/312 |
| 2004/0017130 A1* | 1/2004 | Wang et al. | ................... | 310/311 |
| 2005/0248420 A1* | 11/2005 | Ma et al. | ....................... | 333/191 |
| 2006/0006965 A1 | 1/2006 | Ishii | | |

FOREIGN PATENT DOCUMENTS

JP  2006-50591 A  2/2006

OTHER PUBLICATIONS

Bradley et al., "A Generic 2.0×2.5 mm2 UMTS FBAR Duplexer Based on 8-pole Near-Elliptic Filters", 2009 IEEE International Ultrasonics Symposium Proceedings, pp. 839-842.

* cited by examiner

*Primary Examiner* — Derek Rosenau
(74) *Attorney, Agent, or Firm* — Keating & Bennett, LLP

(57) ABSTRACT

In a piezoelectric device, a lower covering layer, a piezoelectric material layer, a lower electrode layer, and an upper electrode layer, which define common layers, and an upper covering layer, which defines a specific layer, are laminated on a substrate. The piezoelectric material layer is sandwiched between a pair of electrodes. First to third vibration regions are provided in which the electrodes are superimposed with the piezoelectric material layer therebetween when viewed in a transparent manner in the direction in which the layers are laminated. The upper covering layer includes only a portion having with a first thickness in the first vibration region, includes a portion having the first thickness and a portion having a second thickness that is smaller than the first thickness in the second vibration region, and includes only a portion having the second thickness in the third vibration region.

22 Claims, 8 Drawing Sheets

PIEZOELECTRIC DEVICE AND METHOD FOR MANUFACTURING THEREOF

BACKGROUND OF THE INVENTION

1. Field of the Invention

The present invention relates to piezoelectric devices and methods for manufacturing the piezoelectric devices, and more particularly, to a piezoelectric device including a bulk acoustic wave resonator using bulk acoustic waves (BAWs) and a method for manufacturing the piezoelectric device.

2. Description of the Related Art

Piezoelectric devices including bulk acoustic wave resonators (hereinafter, also referred to as "BAW resonators") having different frequencies have been suggested.

For example, as illustrated in a cross-sectional diagram of FIG. 8, a first BAW resonator 111 and a second BAW resonator 112 are provided on a substrate 101 having air gaps 101a. The first BAW resonator 111 includes electrodes 141 and 143 formed on both main surfaces of a piezoelectric film 131. The second BAW resonator 112 includes electrodes 142 and 144 formed on both main surfaces of the piezoelectric film 131. The electrodes 141 and 143 of the first BAW resonator 111 are made of gold (Au). The electrodes 142 and 144 of the second BAW resonator 112 are made of titanium (Ti). The Ti forming the electrodes 142 and 144 of the second BAW resonator 112 etches only the electrodes 141 and 143 of the first BAW resonator 111, which are made of Au, by using an iodine-based etchant, by which Ti is not subjected to etching, and the frequency of the first BAW resonator 111 is adjusted. The Au forming the electrodes 141 and 143 of the first BAW resonator 111 etches only the electrodes 142 and 144 of the second BAW resonator 112, which are made of Ti, by using a fluorine-based etchant, by which Au is not subjected to etching, and the frequency of the second BAW resonator 112 is adjusted. (See, for example, Japanese Unexamined Patent Application Publication No. 2006-50591.)

A technique for using light mass-loading which provides a frequency difference of 0.4% in order to improve the sharpness, as well as heavy mass-loading which provides a frequency difference of 3% between a series resonator and a parallel resonator, is disclosed in P. Bradley, S. Ye, J. Kim, J. H. Kim, K. Wang, H. Ko, and Y. Xie, "A Generic 2.0×2.5 mm² UMTS FBAR Duplexer Based on 8-pole Near-Elliptic Filters", 2009 IEEE International Ultrasonics Symposium Proceedings.

In the case of manufacturing a piezoelectric device including three or more types of resonators having different resonant frequencies, when the method employing a combination of electrode materials and etchants as described in Japanese Unexamined Patent Application Publication No. 2006-50591 is used, two or more types of etchants are required, and it is necessary to perform etching processes a plurality of times.

When the method for providing mass-loading as described in P. Bradley, S. Ye, J. Kim, J. H. Kim, K. Wang, H. Ko, and Y. Xie, "A Generic 2.0×2.5 mm² UMTS FBAR Duplexer Based on 8-pole Near-Elliptic Filters", 2009 IEEE International Ultrasonics Symposium Proceedings is used, there is a need to perform two or more processes for forming mass-loading (including both heavy mass-loading and light mass-loading).

SUMMARY OF THE INVENTION

Accordingly, preferred embodiments of the present invention provide a piezoelectric device including three or more types of resonators having different resonant frequencies and a method for manufacturing such a piezoelectric device by simple processes.

According to a preferred embodiment of the present invention, a piezoelectric device includes a substrate, and at least two common layers and at least one specific layer that are laminated on the substrate. By the common layers and the specific layer, a piezoelectric material is sandwiched between a pair of electrodes, and at least first, second, and third vibration regions are provided in which the pair of electrodes are superimposed with the piezoelectric material therebetween when viewed in a transparent manner in the direction in which the common layers and the specific layer are laminated. The first, second, and third vibration regions are acoustically isolated from the substrate. The specific layer includes a first portion having with a first thickness and a second portion having with a second thickness that is smaller than the first thickness, the first and second portions being provided with different ratios among the first, second, and third vibration regions. Resonators including the corresponding first, second, and third vibration regions have different resonant frequencies.

In this structure, the vibration regions may each include only a facing region where the electrodes face each other with the piezoelectric material therebetween or may each include regions adjacent to both sides or a region adjacent to either side of the facing region in the lamination direction. That is, the common layers and the specific layer may include only layers in which the facing region is provided, that is, a layer in which an electrode is provided and a layer including a piezoelectric material, or may include a layer other than the layers in which the facing region is provided, such as a layer covering an electrode.

With this structure, when the specific layer includes the first portion and the second portion, which have different thicknesses, with different ratios among the first to third vibration regions, the way in which vibrations are propagated differs among the first to third vibration regions. Thus, resonators including the corresponding first to third vibration regions have different resonant frequencies. The specific layer in the first to third vibration regions can be formed at the same time by the same process.

Therefore, a piezoelectric device including three or more types of resonators having different resonant frequencies can be manufactured by simple processes.

Preferably, the specific layer includes only the first portion in the first vibration region, the specific layer includes the first portion and the second portion in the second vibration region, and the specific layer includes only the second portion in the third vibration region. In this case, a resonator exhibiting a frequency characteristic between the frequency characteristic of a resonator in which the specific layer in a vibration region includes only the first portion and the frequency characteristic of a resonator in which the specific layer in a vibration region includes only the second portion can be produced.

According to a preferred embodiment of the present invention, all the common layers are arranged between the specific layer and the substrate.

In this case, the specific layer is the uppermost layer, which is opposite to the substrate. Since the layers are formed in order from the substrate side, the specific layer is formed in a relatively later step and frequency adjustment is performed. Thus, compared to a case where the specific layer is formed in a relatively earlier step, the yield can be increased.

According to another preferred embodiment, the specific layer defines one of the pair of electrodes.

In a preferred embodiment, more preferably, the other one of the pair of electrodes extends between the specific layer and the substrate.

In this case, the specific layer defining the one of the pair of electrodes is formed in a step later than the other one of the pair of electrodes. Thus, compared to a case where the other one of the pair of electrodes is formed later than the specific layer forming the one of the pair of electrodes, the yield is increased.

Preferably, the first portion is arranged in a grid manner.

In this case, formation and removal of a resist can be easily performed. Furthermore, an unwanted spurious component can be reduced.

Preferably, the second portion is arranged in a grid manner.

In this case, formation and removal of a resist can be easily performed. Furthermore, an unwanted spurious component can be reduced.

Preferably, the first portion and the second portion are alternately arranged in a substantially concentric circle shape.

In this case, formation and removal of a resist can be easily performed. Furthermore, an unwanted spurious component can be reduced.

Preferably, the first portion and the second portion are alternately arranged in a substantially similar figure along an outer peripheral line of the vibration region including the first portion and the second portion.

In this case, formation and removal of a resist can be easily performed. Furthermore, an unwanted spurious component can be reduced.

Preferably, the pitch of the second portion is set to about a half or less of a wavelength $\lambda$, which is defined by $\lambda = v/f$, where "f" represents a resonant frequency of the resonator including the second portion and "v" represents an acoustic velocity in the vibration region including the second portion.

In this case, an unwanted spurious component can be reduced.

Preferably, a plurality of second vibration regions having different ratios between the first portion and the second portion are formed.

In this case, four or more resonators having different resonant frequencies can be easily formed.

In addition, according to another preferred embodiment of the present invention, a method for manufacturing a piezoelectric device includes, in sequence, forming the specific layer having the first thickness for the first, second, and third vibration regions, and performing etching on the specific layer in at least one of the first, second, and third vibration regions, so that the second portion is formed.

In this case, fine frequency adjustment can be easily achieved by etching.

In addition, according to another preferred embodiment of the present invention, a method for manufacturing the piezoelectric device includes, in sequence, performing film formation of the specific layer with a uniform film thickness up to the second thickness for the first, second, and third vibration regions, and forming the first portion in at least one of the first, second, and third vibration regions.

In this case, frequency adjustment can be performed without increasing the number of processes.

Accordingly, a piezoelectric device including three or more types of resonators having different resonant frequencies can be manufactured by simple processes.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Hereinafter, preferred embodiments of the present invention will be described with reference to FIGS. 1 to 7.

First Preferred Embodiment

A piezoelectric device 10 according to a first preferred embodiment of the present invention will be described with reference to FIGS. 1 to 3.

Figure 1:
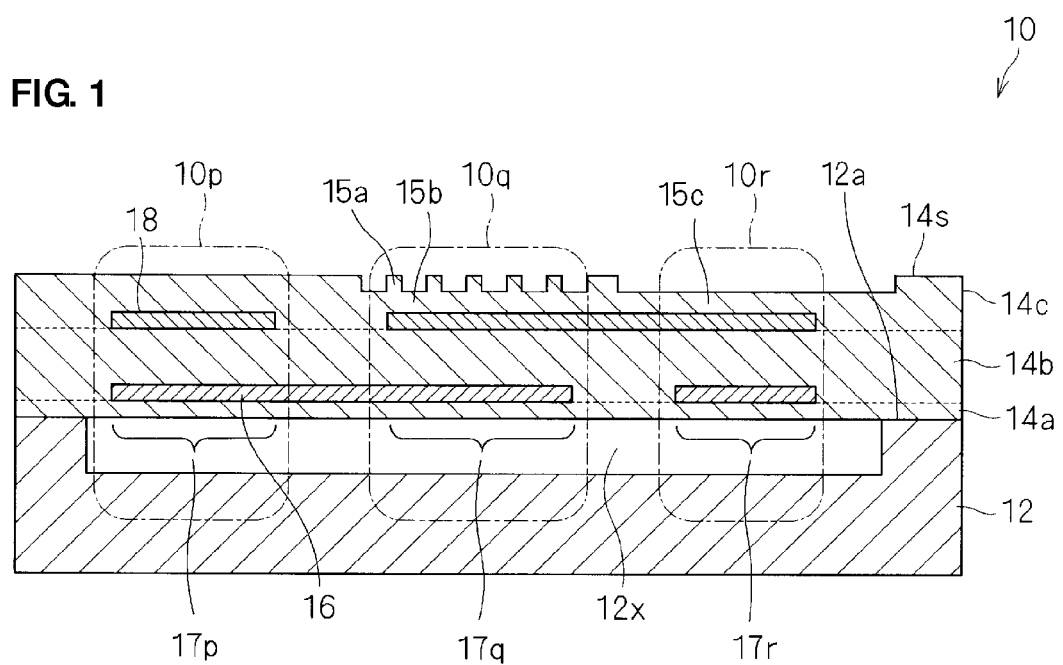
FIG. 1 is a cross-sectional diagram of a piezoelectric device according to a first preferred embodiment of the present invention.

FIG. 1 is a cross-sectional diagram of a principal portion of the piezoelectric device 10. As illustrated in FIG. 1, a lower covering layer 14a, a lower electrode layer 16, a piezoelectric material layer 14b, an upper electrode layer 18, and an upper covering layer 14c are laminated in that order on an upper surface 12a of a substrate 12. The lower electrode layer 16 and the upper electrode layer 18 each include an electrode and a wire connected to the electrode. The lower electrode layer 16 and the upper electrode layer 18 are patterned such that the electrode of the lower electrode layer 16 and the electrode of the upper electrode layer 18 are superimposed when viewed in a transparent manner from the lamination direction (the vertical direction in FIG. 1). A portion including a first vibration region 17p, a second vibration region 17q, and a third vibration region 17r where the electrode of the lower electrode layer 16 and the electrode of the upper electrode layer 18 are superimposed when viewed in a transparent manner from the lamination direction is arranged on a recessed portion 12x, which is formed on the side of the upper surface 12a of the substrate 12. Thus, the lower covering layer 14a, the piezoelectric material layer 14b, the upper covering layer 14c, the lower electrode layer 16, and the upper electrode layer 18 are acoustically isolated from the substrate 12 with an air gap therebetween. That is, although a vibration generated by excitation caused by applying a voltage between the electrode of the lower electrode layer 16 and the electrode of the upper electrode layer 18 is propagated inside the first to third vibration regions 17p to 17r, the vibration is not propagated to the substrate 12.

The piezoelectric device 10 includes resonators 10p to 10r. The resonator 10p includes the first vibration region 17p. The resonator 10q includes the second vibration region 17q. The resonator 10r includes the third vibration region 17r. The resonators 10p to 10r have similar configurations with the exception of the shape of an upper surface 14s of the upper covering layer 14c. The upper covering layer 14c defines a specific layer of a preferred embodiment of the present invention. The lower covering layer 14a, the lower electrode layer 16, the piezoelectric material layer 14b, and the upper electrode layer 18 define common layers of a preferred embodiment of the present invention.

Figure 2:
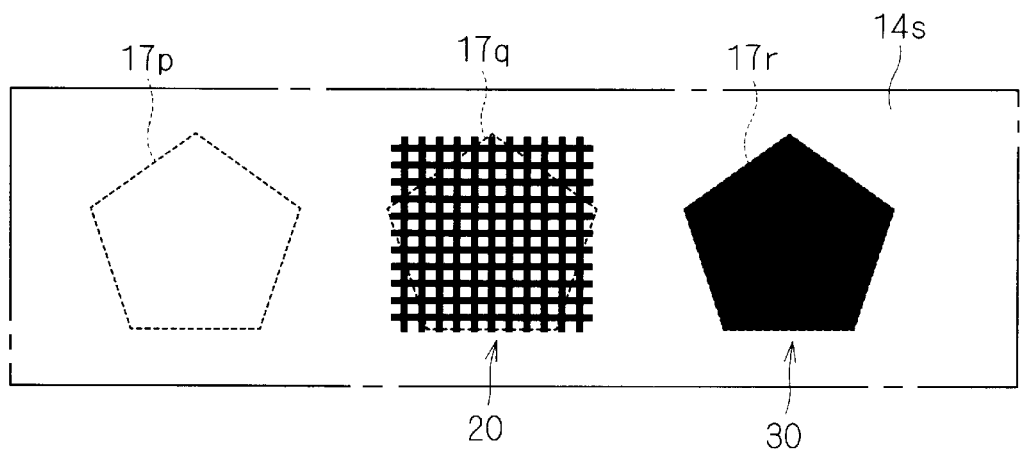
FIG. 2 is an explanatory diagram illustrating etching patterns used in the first preferred embodiment of the present invention.

FIG. 2 is an explanatory diagram illustrating etching patterns for the upper surface 14s of the upper covering layer 14c. As illustrated in FIG. 2, the upper surface 14s of the upper covering layer 14c is etched in accordance with etching patterns 20 and 30 shown in black.

That is, the upper surface 14s of the upper covering layer 14c in the first vibration region 17p is not etched. A portion of the upper surface 14s of the upper covering layer 14c in the second vibration region 17q is etched in accordance with the etching pattern 20, which is a grid-shaped pattern. As illustrated in FIG. 1, the etching pattern 20 may be extended outside of the second vibration region 17q. The whole upper surface 14s of the upper covering layer 14c in the third vibration region 17r is etched in accordance with the etching pattern 30 illustrated in FIG. 2. The etching pattern 30 may be extended outside of the third vibration region 17r, as illustrated in FIG. 1.

As illustrated in FIG. 1, in the first vibration region 17p, the upper covering layer 14c maintains the original film thickness (first thickness). In the second vibration region 17q, the film thickness of a portion of the upper covering layer 14c is reduced, and the upper covering layer 14c includes a first portion 15a having the original film thickness and a second portion 15b having a film thickness (second thickness) that is smaller than the original film thickness. In the third vibration region 17r, the film thickness of the whole upper covering layer 14c is reduced, and the upper covering layer 14c includes only a second portion 15c having a film thickness (second thickness) that is smaller than the original film thickness.

Since mass-loading based on the upper covering layer 14c differs among the first to third vibration regions 17p to 17r, the resonators 10p to 10r have different frequency characteristics.

An example of a method of manufacturing the piezoelectric device 10 will now be explained.

First, the lower covering layer 14a, the lower electrode layer 16, the piezoelectric material layer 14b, the upper electrode layer 18, and the upper covering layer 14c are formed in that order on the upper surface 12a of the substrate 12, and patterning is performed.

More specifically, an AlN film having a film thickness of about 30 nm, for example, is formed as the lower covering layer 14a. A W film having a film thickness of about 620 nm, for example, is formed as the lower electrode layer 16. An AlN film having a film thickness of about 1590 nm, for example, is formed as the piezoelectric material layer 14b. A W film having a film thickness of about 540 nm, for example, is formed as the upper electrode layer 18. An AlN film having a film thickness of about 330 nm, for example, is formed as the upper covering layer 14c.

Next, a resist pattern is formed on the upper surface 14s of the upper covering layer 14c, which is the uppermost layer, and etching is performed.

In the first vibration region 17p, the resist pattern is arranged so as to cover the entire first vibration region 17p. In the second vibration region 17q, the resist pattern is arranged in an inverted grid manner so as to cover the second vibration region 17q with a resist pitch of about 1000 nm and an area ratio of about 50%, for example. In the third vibration region 17r, the resist pattern is arranged so as to have an opening portion to which the entire third vibration region 17r is exposed.

By etching the upper covering layer 14c in different manners for the first to third vibration regions 17p to 17r, the resonator 10q exhibiting a frequency characteristic between the frequency characteristic of the etched resonator 10r and the frequency characteristic of the non-etched resonator 10p can be produced. Furthermore, by a single etching operation, the resonators 10p to 10r having three types (an etched type, a non-etched type, and an intermediate type between the etched type and the non-etched type) of frequency characteristics can be produced.

Instead of etching the upper covering layer 14c, the lower covering layer 14a may be etched. However, since the yield is increased as etching is performed in a later step, it is preferable that etching be performed on the upper covering layer 14c rather than the lower covering layer 14a.

By performing film formation for the upper covering layer 14c with a uniform film thickness and then adjusting the film thickness by etching appropriate for the first to third vibration regions 17p to 17r, fine frequency adjustment can be easily achieved.

In the case where the upper covering layer 14c in the second vibration region 17q is arranged in a grid manner, producing of a resist pattern to be used for etching and resist removal after etching can be easily performed. Furthermore, since vibrations are diffusely reflected due to the uneven shape, which is formed by etching, an unwanted spurious component can be reduced.

In a case where etching is performed for the second vibration region 17q in a grid manner, it is desirable that the resist pitch be set to about $\lambda/2$ or less, for example. Here, "$\lambda$" represents a wavelength defined by $\lambda=v/f$, where "f" represents the resonant frequency of a resonator and "v" represents the average acoustic velocity in a vibration region. The first thickness in the second vibration region 17q is preferably about $\lambda/2$, for example. Since the etched portion (the second portion 15b) and the non-etched portion (the first portion 15a) function as resonators having different frequencies when the resist pitch is greater than about $\lambda/2$, it is desirable that the resist pitch is set to about $\lambda/2$ or less, for example. By setting the resist pitch to about $\lambda/2$ or less, an unwanted spurious component can be reduced. The unevenness of the surface becomes finer and the heat dissipation becomes greater as the resist pitch is decreased.

For the upper covering layer 14c, after film formation is performed with a uniform film thickness up to the second thickness (the thickness in the third vibration region 17r), which is a common thickness among the first to third vibration regions 17p to 17r, partial film formation may be performed. For example, after film formation is performed with a uniform thickness up to the common second thickness, film formation is performed using a metal mask in which openings are arranged in accordance with the first to third vibration regions 17p to 17r. Then, required thickness is added for the first and second vibration regions 17p and 17q, so that the first thickness is achieved. In this case, no etching process is required, and frequency adjustment can be achieved without increasing the number of processes.

In order to achieve the frequency characteristic of the intermediate type between the etched type and the non-etched type, the upper surface 14s of the upper covering layer 14c in a vibration region 17 may be etched in accordance with any of etching patterns 22 to 27 illustrated in FIGS. 3A-3F.

Figure 3A:
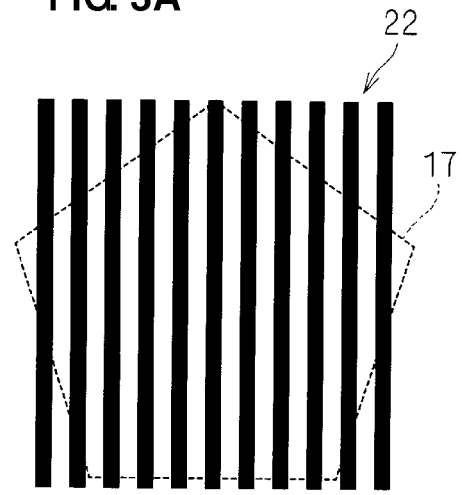
FIGS. 3A-3F are schematic diagrams illustrating etching patterns used in a modification of the first preferred embodiment of the present invention.
Figure 3B:
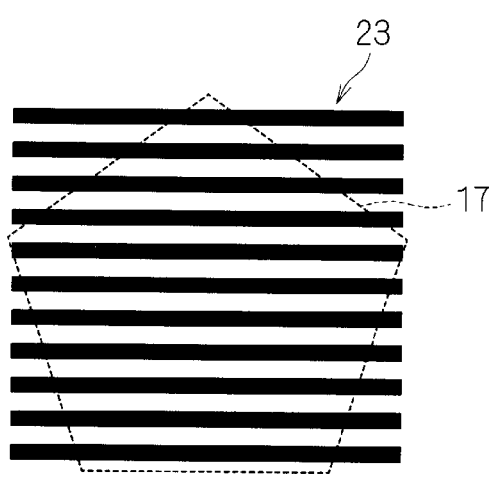

FIG. 3A illustrates an example of the etching pattern 22, which is a vertical stripe pattern. FIG. 3B illustrates an example of the etching pattern 23, which is a horizontal stripe pattern. The stripes are not necessarily straight lines and may be curved lines.

Figure 3C:
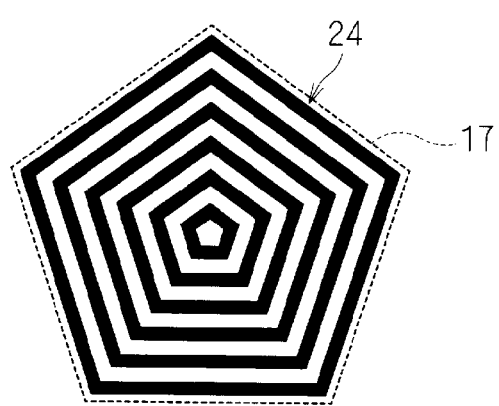

FIG. 3C illustrates an example of the etching pattern 24, in which etching is performed so as to form a substantially similar figure along the outer periphery of the vibration region 17. In this case, etched portions and non-etched portions are alternately arranged so as to form a substantially similar figure along the outer peripheral line of the vibration region 17.

Figure 3D:
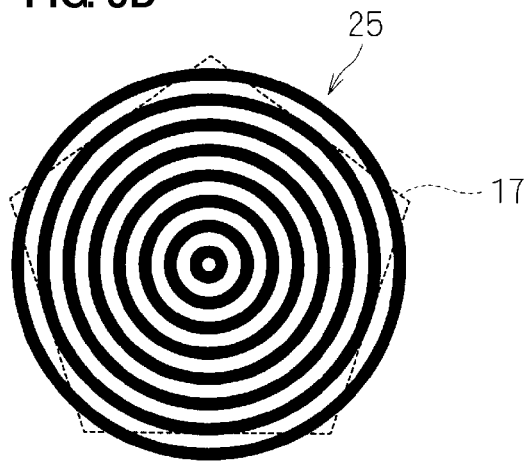
Figure 3E:
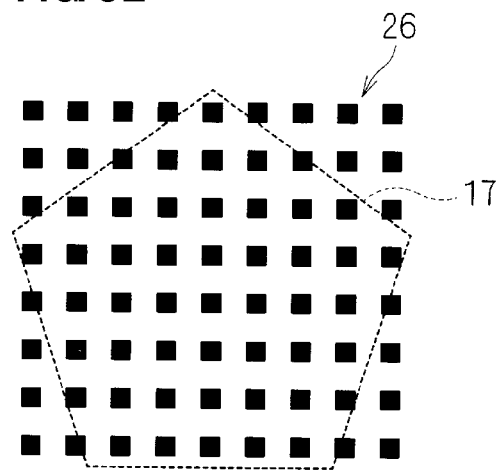
Figure 3F:
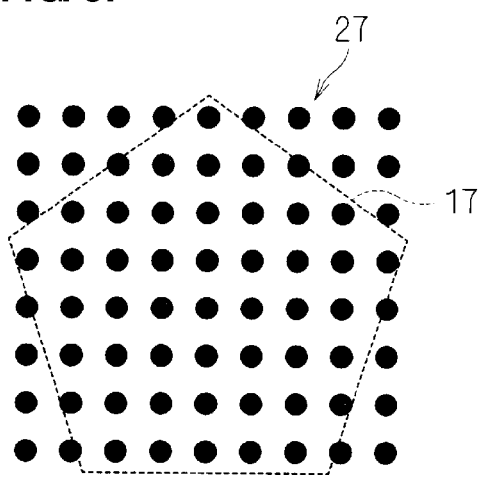

FIG. 3D illustrates an example of the etching pattern 25, which is a substantially concentric circle pattern. In this case, etched portions and non-etched portions are alternately arranged in a substantially concentric circle shape. FIG. 3E illustrates an example of the etching pattern 26, which is an inverted grid pattern. The etching pattern 26 is formed by performing etching using a grid-shaped resist pattern. FIG. 3F illustrates an example of the etching pattern 27, which is an inverted grid pattern. The etching pattern 27 is formed by performing etching in a substantially circular shape with regular intervals vertically and horizontally.

The etching patterns 26 and 27 illustrated in FIGS. 3E and 3F preferably are regularly arranged etching patterns. However, the etching patterns 26 and 27 may each be arranged in a randomly scattered pattern.

In the case where the upper surface 14s of the upper covering layer 14c in the vibration region 17 is partially etched in accordance with any of the etching patterns 22 to 27 illustrated in FIGS. 3A-3F, producing of a resist pattern to be used for etching and resist removal after etching can be easily performed. Furthermore, since vibrations are diffusely reflected due to the uneven shape, which is formed by etching, an unwanted spurious component can be reduced.

Also in the examples illustrated in FIGS. 3A-3F, it is desirable that the resist pitch is set to about $\lambda/2$ or less, for example. Here, "$\lambda$" represents a wavelength defined by $\lambda=v/f$, where "f" represents the resonant frequency of a resonator and "v" represents the average acoustic velocity in the vibration region 17.

Second Preferred Embodiment

A piezoelectric device 10a according to a second preferred embodiment of the present invention will be described with reference to FIGS. 4 and 5.

Figure 4:
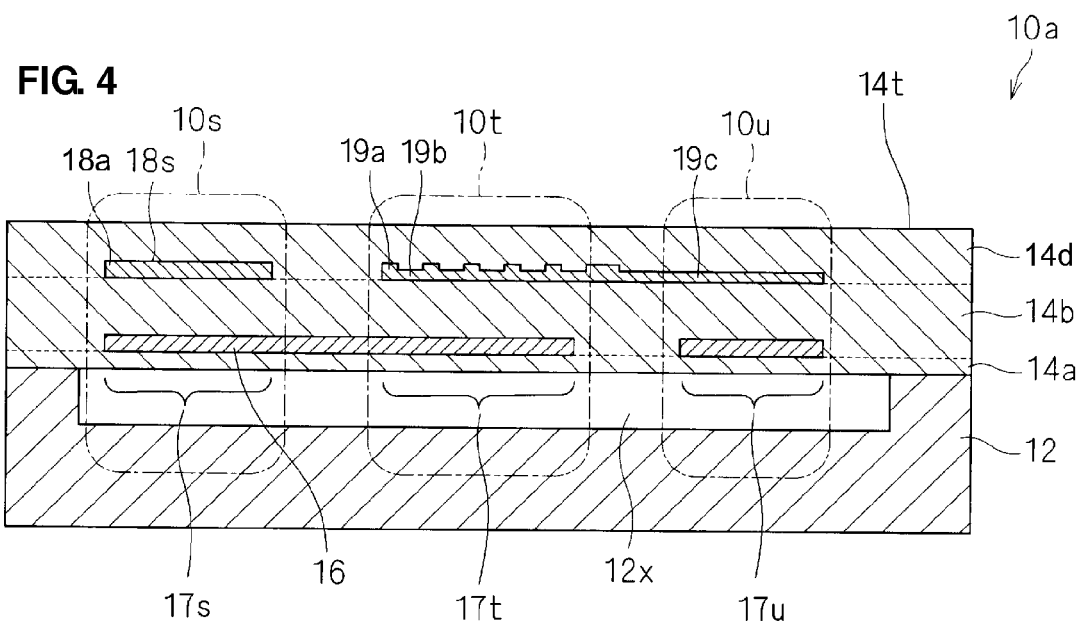
FIG. 4 is a cross-sectional diagram of a piezoelectric device according to a second preferred embodiment of the present invention.

FIG. 4 is a cross-sectional diagram illustrating a principal part of the piezoelectric device 10a. As illustrated in FIG. 4, the piezoelectric device 10a according to the second preferred embodiment is configured substantially similar to the piezoelectric device 10 according to the first preferred embodiment. Hereinafter, the same components as those in the first preferred embodiment will be referred to with the same reference numerals and signs and differences from the first preferred embodiment will be mainly explained.

As illustrated in FIG. 4, similarly to the first preferred embodiment, the lower covering layer 14a, the lower electrode layer 16, the piezoelectric material layer 14b, the upper electrode layer 18a, and the upper covering layer 14d are laminated in that order on the upper surface 12a of the substrate 12. A first vibration region 17s, a second vibration region 17t, and a third vibration region 17u, in which the electrode of the lower electrode layer 16 and the electrode of the upper electrode layer 18a are superimposed when viewed in a transparent manner in the lamination direction, are arranged on the recessed portion 12x located on the side of the upper surface 12a of the substrate 12. The piezoelectric device 10a includes resonators 10s to 10u. The resonator 10s includes the first vibration region 17s. The resonator 10t includes the second vibration region 17t. The resonator 10u includes the third vibration region 17u.

Unlike the first preferred embodiment, in the piezoelectric device 10a according to the second preferred embodiment, etching is performed on an upper surface 18s of the upper electrode layer 18a, not on an upper surface 14t of the upper covering layer 14d. The upper electrode layer 18a defines a specific layer of a preferred embodiment of the present invention. The lower covering layer 14a, the lower electrode layer 16, the piezoelectric material layer 14b, and the upper covering layer 14d define common layers of the preferred embodiment of the present invention.

Figure 5:
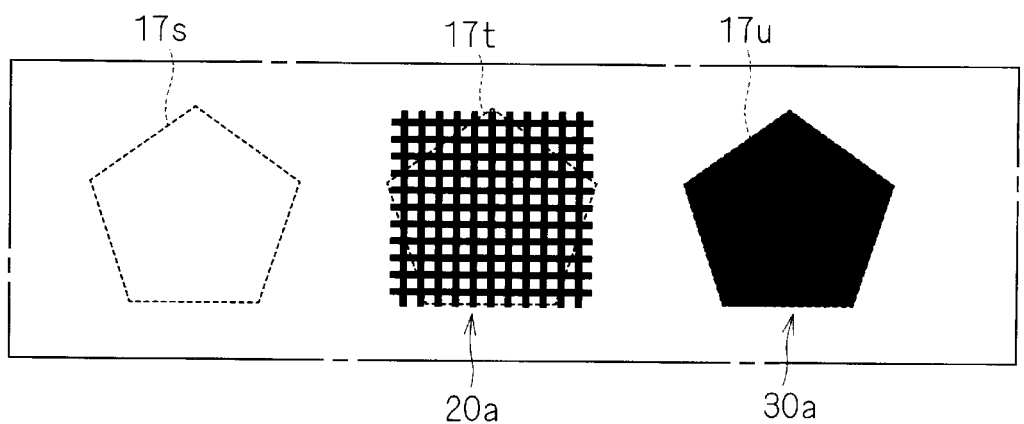
FIG. 5 is an explanatory diagram illustrating etching patterns used in the second preferred embodiment of the present invention.

FIG. 5 is an explanatory diagram illustrating etching patterns for the upper surface 18s of the upper electrode layer 18a. As illustrated in FIG. 5, the upper surface 18s of the upper electrode layer 18a is etched in accordance with etching patterns 20a and 30a shown in black.

That is, the upper electrode layer 18a in the first vibration region 17s is not etched. A portion of the upper surface 18s of the upper electrode layer 18a in the second vibration region 17t is etched in accordance with the etching pattern 20a, which is a grid-shaped pattern. As illustrated in FIG. 4, the etching pattern 20a may be extended outside of the second vibration region 17t. The whole upper surface 18s of the upper electrode layer 18a in the third vibration region 17u is etched in accordance with the etching pattern 30a, which covers the entire third vibration region 17u. The etching pattern 30a may be extended outside of the third vibration region 17u, as illustrated in FIG. 4.

As illustrated in FIG. 4, in the first vibration region 17s, the upper electrode layer 18a maintains the original film thickness (first thickness). In the second vibration region 17t, the film thickness of portion of the upper electrode layer 18a is reduced, and the upper electrode layer 18a includes a first portion 19a having the original film thickness and a second portion 19b having a film thickness (second thickness) that is smaller than the original film thickness. In the third vibration region 17u, the film thickness of the whole upper electrode layer 18a is reduced, and the upper electrode layer 18a includes only a second portion 19c having a film thickness (second thickness) that is smaller than the original film thickness.

The resonators 10s to 10u have similar configurations with the exception of the upper electrode layer 18a. Since mass-loading based on the upper electrode layer 18a differs among the first to third vibration regions 17s to 17u, the resonators 10s to 10u have different frequency characteristics.

Instead of etching the upper electrode layer 18a, the upper surface of the lower electrode layer 16 may be etched. However, since the yield is increased as etching is performed in a later step, it is preferable that etching be performed on the upper surface 18s of the upper electrode layer 18a rather than the upper surface of the lower electrode layer 16.

By etching the upper surface 18s of the upper electrode layer 18a in different manners for the first to third vibration regions 17s to 17u, the resonator 10t exhibiting a frequency characteristic between the frequency characteristic of the etched resonator 10u and the frequency characteristic of the non-etched resonator 10s can be produced. Furthermore, by performing a single etching operation, the resonators 10s to 10u having three types (an etched type, a non-etched type, and an intermediate type between the etched type and the non-etched type) of frequency characteristics can be produced.

By performing film formation for the upper electrode layer 18a with a uniform film thickness and then adjusting the film thickness by etching appropriate for the first to third vibration regions 17s to 17u, fine frequency adjustment can be easily achieved.

In the case where the upper surface 18s of the upper electrode layer 18a in the second vibration region 17t is arranged in a grid manner, producing of a resist pattern to be used for etching and resist removal after etching can be easily performed. Furthermore, since vibrations are diffusely reflected due to the uneven shape, which is formed by etching, an unwanted spurious component can be reduced.

In a case where etching is performed for the upper surface 18s of the upper electrode layer 18a in the second vibration region 17t in a grid manner, it is desirable that the resist pitch be set to about $\lambda/2$ or less. Here, "$\lambda$" represents a wavelength defined by $\lambda=v/f$, where "f" represents the resonant frequency of a resonator and "v" represents the average acoustic velocity in a vibration region. The first thickness in the second vibration region 17t is designed to be about $\lambda/2$, for example. Since the etched second portion 19b and the non-etched first portion 19a function as resonators having different frequencies when the resist pitch is greater than about $\lambda/2$, it is desirable that the resist pitch be set to about $\lambda/2$ or less, for example. By setting the resist pitch to about $\lambda/2$ or less, an unwanted spurious component can be reduced. The degree of adhesion to the upper covering layer 14d is increased as the resist pitch is decreased.

For the upper electrode layer 18a, after film formation is performed with a uniform film thickness up to the second thickness (the thickness in the third vibration region 17u), which is a common thickness among the first to third vibration regions 17s to 17u, partial film formation may be performed. For example, after film formation is performed with a uniform thickness up to the common second thickness, film formation is performed using a metal mask in which openings are arranged in accordance with the first to third vibration regions 17s to 17u. Then, required thickness is added for the first and second vibration regions 17s and 17t, so that the first thickness is achieved. In this case, no etching process is required, and frequency adjustment can be achieved without increasing the number of processes.

Third Preferred Embodiment

A piezoelectric device 10b according to a third preferred embodiment of the present invention will be described with reference to FIGS. 6 and 7A-7C.

Figure 6:
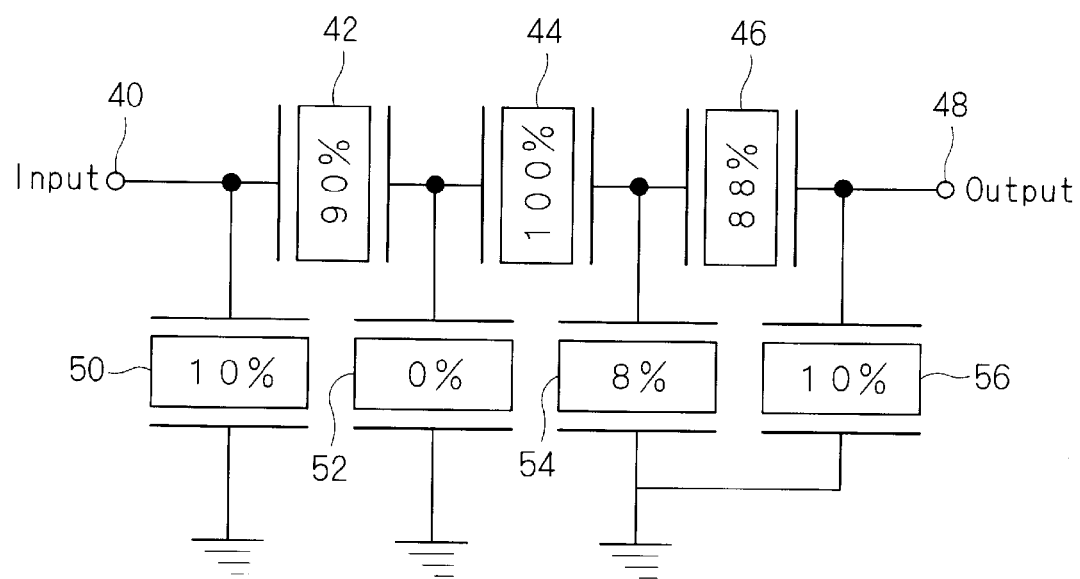
FIG. 6 is an electric circuit diagram of a piezoelectric device according to a third preferred embodiment of the present invention.

FIG. 6 is an electric circuit diagram of the piezoelectric device 10b. As illustrated in FIG. 6, the piezoelectric device 10b according to the third preferred embodiment defines a filter in which series-arm resonators 42, 44, and 46 and parallel-arm resonators 50, 52, 54, and 56 are coupled between an input terminal 40 and an output terminal 48 in a ladder shape.

The values (%) illustrated in FIG. 6 indicate the area ratio in a case where etching is performed on the upper surface of an upper covering layer or the upper surface of an upper electrode layer in a vibration region for each of the resonators 42, 44, 46, 50, 52, 54, and 56, as in the first or second preferred embodiment. Etching may be performed on a lower covering layer or a lower electrode layer.

Figure 7A:
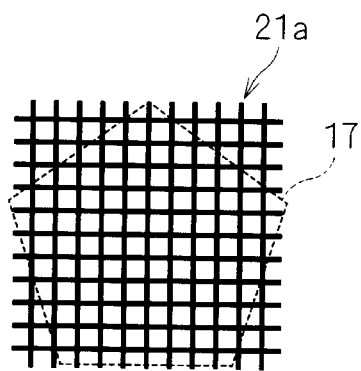
FIGS. 7A-7C are explanatory diagrams illustrating etching patterns used in the third preferred embodiment of the present invention.
Figure 7B:
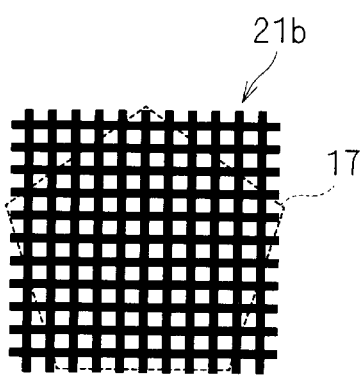
Figure 7C:
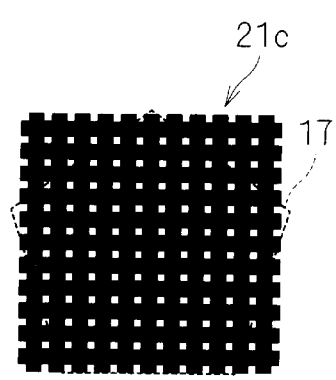
Figure 8:
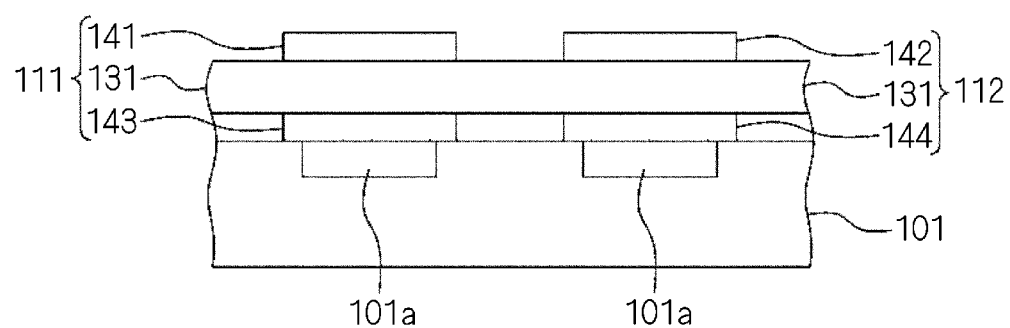
FIG. 8 is a cross-sectional diagram of a piezoelectric device according to related art.

FIGS. 7A-7C are explanatory diagrams illustrating etching patterns. As illustrated in FIGS. 7A-7C, in the case of etching in a grid manner, the same grid pitch is preferably used and the line width is changed in accordance with the area ratio. FIG. 7A illustrates an etching pattern 21a for etching with an area ratio of about 20%, for example. FIG. 7B illustrates an etching pattern 21b for etching with an area ratio of about 50%, for example. FIG. 7C illustrates an etching pattern 21c for etching with an area ratio of about 80%, for example.

In the piezoelectric device 10b, by performing etching on the upper surface of the upper covering layer or the upper surface of the upper electrode layer with different area ratios for the vibration regions of the corresponding resonators 42, 44, 46, 50, 52, 54, and 56, the frequencies of the resonators 42, 44, 46, 50, 52, 54, and 56 can be adjusted at the same time.

As described above, a piezoelectric device including three or more types of resonators having different resonant frequencies can be manufactured by simple processes according to various preferred embodiments of the present invention.

The present invention is not limited to the preferred embodiments described above. Various changes can be made to the present invention and preferred embodiments thereof.

For example, a lower covering layer or an upper covering layer is not necessarily required and may be omitted.

In addition, instead of arranging a recessed portion in the substrate, a vibration region may be acoustically isolated from the substrate by forming a sacrificial layer on the substrate, forming individual layers, and then eliminating the sacrificial layer so that the vibration region can float from the substrate. Alternatively, the vibration region may be acoustically isolated from the substrate by providing an acoustic reflection layer, in which layers exhibiting a relatively low acoustic impedance and layers exhibiting a relatively high acoustic impedance are alternately laminated, between the substrate and the vibration region.

Although a piezoelectric device including both the resonator in which the specific layer in a vibration region includes only the first portion and the resonator in which the specific layer in a vibration region includes only the second portion has been exemplified, the piezoelectric device may have a configuration including one of the resonator in which the specific layer in a vibration region includes only the first portion and the resonator in which the specific layer in a vibration region includes only the second portion and a resonator in which the specific layer in a vibration region includes both the first portion and the second portion or a configuration including a plurality of resonators each in which the specific layer in a vibration region includes both the first portion and the second portion.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A piezoelectric device comprising:
   a substrate;
   at least two common layers; and
   at least one specific layer, the at least two common layers and the at least one specific layer being laminated on the substrate; wherein
   the at least two common layers and the at least one specific layer are arranged such that only a single piezoelectric material layer is sandwiched between a pair of electrodes including a lower electrode layer and an upper electrode layer, and at least first, second, and third vibration regions are provided in which the pair of electrodes are superimposed with the single piezoelectric material layer therebetween when viewed in a direction in which the at least two common layers and the at least one specific layer are laminated;

the first, second, and third vibration regions are acoustically isolated from the substrate;

the at least one specific layer includes a first portion having a first thickness and a second portion having a second thickness that is smaller than the first thickness, a ratio of the first portion to the second portion is different among the first, second, and third vibration regions;

resonators including the corresponding first, second, and third vibration regions have different resonant frequencies;

each of the at least two common layers has substantially the same structure in each of the first, second, and third vibration regions;

the at least one specific layer has a different structure in each of the first, second, and third vibration regions; and at least two of the first, second, and third vibration regions share one common air gap defined by a recessed portion of the substrate.

2. The piezoelectric device according to claim 1, wherein the at least one specific layer includes only the first portion in the first vibration region, the at least one specific layer includes the first portion and the second portion in the second vibration region, and the at least one specific layer includes only the second portion in the third vibration region.

3. The piezoelectric device according to claim 1, wherein all the at least two common layers are arranged between the at least one specific layer and the substrate.

4. The piezoelectric device according to claim 1, wherein the at least one specific layer is defined by the upper electrode layer of the pair of electrodes.

5. The piezoelectric device according to claim 4, wherein the lower electrode layer of the pair of electrodes extends between the at least one specific layer and the substrate.

6. The piezoelectric device according to claim 1, wherein the first portion is arranged in a grid manner.

7. The piezoelectric device according to claim 1, wherein the second portion is arranged in a grid manner.

8. The piezoelectric device according to claim 1, wherein the first portion and the second portion are alternately arranged in a substantially concentric circle shape.

9. The piezoelectric device according to claim 1, wherein the first portion and the second portion are alternately arranged in a substantially similar configuration along an outer peripheral line of the vibration region including the first portion and the second portion.

10. The piezoelectric device according to claim 6, wherein a pitch of the second portion is about one half or less of a wavelength $\lambda$, which is defined by $\lambda=v/f$, where "f" represents a resonant frequency of the resonator including the second portion and "v" represents an acoustic velocity in the vibration region including the second portion.

11. The piezoelectric device according to claim 1, wherein a plurality of second vibration regions having different ratios between the first portion and the second portion are provided.

12. The piezoelectric device according to claim 1, wherein the different structure of the at least one specific layer is defined by an etched portion produced by a single etching step.

13. A piezoelectric device comprising:
a substrate;
at least two common layers; and
at least one specific layer, the at least two common layers and the at least one specific layer being laminated on the substrate; wherein the at least two common layers and the at least one specific layer are arranged such that only a single piezoelectric material layer is sandwiched between a pair of electrodes including a lower electrode layer and an upper electrode layer, and at least first, second, and third vibration regions are provided in which the pair of electrodes are superimposed with the single piezoelectric material layer therebetween when viewed in a direction in which the at least two common layers and the at least one specific layer are laminated;

the first, second, and third vibration regions are acoustically isolated from the substrate;

the at least one specific layer includes a first portion having a first thickness and a second portion having a second thickness that is smaller than the first thickness, a ratio of the first portion to the second portion is different among the first, second, and third vibration regions;

resonators including the corresponding first, second, and third vibration regions have different resonant frequencies;

each of the at least two common layers has substantially the same structure in each of the first, second, and third vibration regions;

the at least one specific layer has a different structure in each of the first, second, and third vibration regions;

the at least two common layers are defined by at least two of a lower covering layer, the lower electrode layer, the single piezoelectric material layer, and the upper electrode layer;

the at least one specific layer is defined by an upper covering layer; and at least two of the first, second, and third vibration regions share one common air gap defined by a recessed portion of the substrate.

14. The piezoelectric device according to claim 13, wherein the at least one specific layer includes only the first portion in the first vibration region, the at least one specific layer includes the first portion and the second portion in the second vibration region, and the at least one specific layer includes only the second portion in the third vibration region.

15. The piezoelectric device according to claim 13, wherein the first portion and the second portion are alternately arranged in a substantially concentric circle shape.

16. The piezoelectric device according to claim 13, wherein the first portion and the second portion are alternately arranged in a substantially similar configuration along an outer peripheral line of the vibration region including the first portion and the second portion.

17. The piezoelectric device according to claim 13, wherein the different structure of the at least one specific layer is defined by an etched portion produced by a single etching step.

18. A piezoelectric device comprising:
a substrate;
at least two common layers; and
at least one specific layer, the at least two common layers and the at least one specific layer being laminated on the substrate; wherein the at least two common layers and the at least one specific layer are arranged such that only a single piezoelectric material layer is sandwiched between a pair of electrodes including a lower electrode layer and an upper electrode layer, and at least first, second, and third vibration regions are provided in which the pair of electrodes are superimposed with the single piezoelectric material layer therebetween when viewed in a direction in which the at least two common layers and the at least one specific layer are laminated;

the first, second, and third vibration regions are acoustically isolated from the substrate;

the at least one specific layer includes a first portion having a first thickness and a second portion having a second thickness that is smaller than the first thickness, a ratio of the first portion to the second portion is different among the first, second, and third vibration regions;

resonators including the corresponding first, second, and third vibration regions have different resonant frequencies;

each of the at least two common layers has substantially the same structure in each of the first, second, and third vibration regions;

the at least one specific layer has a different structure in each of the first, second, and third vibration regions;

the at least two common layers are defined by at least two of a lower covering layer, the lower electrode layer, the single piezoelectric material layer, and an upper covering layer;

the at least one specific layer is defined by the upper electrode layer; and at least two of the first, second, and third vibration regions share one common air gap defined by a recessed portion of the substrate.

19. The piezoelectric device according to claim 18, wherein the at least one specific layer includes only the first portion in the first vibration region, the at least one specific layer includes the first portion and the second portion in the second vibration region, and the at least one specific layer includes only the second portion in the third vibration region.

20. The piezoelectric device according to claim 18, wherein the first portion and the second portion are alternately arranged in a substantially concentric circle shape.

21. The piezoelectric device according to claim 18, wherein the first portion and the second portion are alternately arranged in a substantially similar configuration along an outer peripheral line of the vibration region including the first portion and the second portion.

22. The piezoelectric device according to claim 18, wherein the different structure of the at least one specific layer is defined by an etched portion produced by a single etching step.

* * * * *